United States Patent
Heertjes et al.

(10) Patent No.: US 7,817,243 B2
(45) Date of Patent: Oct. 19, 2010

(54) VIBRATION ISOLATION SYSTEM

(75) Inventors: Marcel François Heertjes, Best (NL); Jan-Gerard Cornelis Van Der Toorn, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 747 days.

(21) Appl. No.: 10/822,139

(22) Filed: Apr. 12, 2004

(65) Prior Publication Data

US 2005/0224687 A1   Oct. 13, 2005

(51) Int. Cl.
    *G03B 27/42* (2006.01)

(52) U.S. Cl. .................... 355/53; 355/67; 188/378; 318/649; 267/140.14

(58) Field of Classification Search ............ 267/140.14, 267/140.15, 137, 378, 379, 380; 248/638, 248/550, 562, 559; 355/53, 67; 188/378, 188/379, 380; 318/649, 489, 460, 638, 648
See application file for complete search history.

(56) References Cited

U.S. PATENT DOCUMENTS

| | | | | |
|---|---|---|---|---|
| 5,734,246 | A * | 3/1998 | Falangas ............... | 318/649 |
| 6,123,312 | A * | 9/2000 | Dai ...................... | 248/550 |
| 6,186,485 | B1 * | 2/2001 | Kawazoe ............... | 267/140.14 |
| 6,523,695 | B1 * | 2/2003 | Ueta et al. ............. | 267/136 |
| 6,538,719 | B1 * | 3/2003 | Takahashi et al. ...... | 355/53 |
| 6,754,444 | B2 * | 6/2004 | Harada et al. .......... | 396/52 |
| 6,791,664 | B2 * | 9/2004 | Auer et al. ............. | 355/53 |
| 2002/0046677 | A1 * | 4/2002 | Okubo et al. .......... | 105/163.1 |
| 2002/0104950 | A1 * | 8/2002 | Mayama ............... | 248/638 |
| 2002/0149754 | A1 * | 10/2002 | Auer et al. ............ | 355/53 |

FOREIGN PATENT DOCUMENTS

| | | | |
|---|---|---|---|
| JP | 6117487 | * | 4/1994 |
| JP | 10-112433 | A | 4/1998 |
| JP | 10-275756 | A | 10/1998 |
| JP | 2000182955 | A * | 6/2000 |
| JP | 2001-200886 | A | 7/2001 |
| JP | 2002-289515 | A | 10/2002 |
| JP | 2003-309055 | A | 10/2003 |

OTHER PUBLICATIONS

Subrahmanyan et al., "Active Vibration Isolation Design for a Photolithographic Stepper," Proc. 6th International Symposium on Magnetic Bearings, MIT (Cambridge, MA), p. 10-21, (1998).
Decision of Rejection for Japanese Patent Application No. 2005-140319 mailed Apr. 1, 2009, 2 pgs.

\* cited by examiner

*Primary Examiner*—Kimberly T Wood
(74) *Attorney, Agent, or Firm*—Sterne, Kessler, Goldstein & Fox P.L.L.C.

(57) ABSTRACT

A vibration isolation system isolates a body from its surroundings with respect to vibrations. The vibration isolation system includes active isolator devices that isolate and damp the body in unstable directions. However, such active isolators may exert damping forces not only in the unstable direction, but simultaneously in other stable directions due to mechanical coupling of the stable and unstable directions. As a result the damping and isolation in the other stable directions may be deteriorated due to the active isolation and damping. Employing modal decoupling, i.e. decomposing any vibration into independent directions, and isolating and damping in the independent directions, enables compensation of any vibration in an unstable direction without influencing the isolation and damping performance in any other, possibly stable, direction.

4 Claims, 3 Drawing Sheets

VIBRATION ISOLATION SYSTEM

BACKGROUND OF THE INVENTION

1. Field of the Invention

The present invention relates to a vibration isolation system, vibration isolation method, a lithographic apparatus and a device manufacturing method. The present invention also relates to vibration isolation using modal decoupling.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of one, or several, dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

In a prior art lithographic apparatus, a projection system for projecting a patterned beam onto a target portion of the substrate is supported by and positioned relative to a metrology frame. The metrology frame is supported by and positioned relative to a base frame.

Vibrations of the projection system may cause incorrect projections on the substrate rendering the substrate unusable. Therefore, any vibration of the projection system is to be prevented. The base frame however is coupled to the environment of the lithographic apparatus, such as a factory floor. The base frame passes any vibration of the environment on to any body rigidly coupled to the base frame. The metrology frame is not rigidly coupled to the base frame, but is coupled and supported using springs, preferably air springs, which isolate and damp certain vibrations. Other vibrations need to be isolated and damped by active isolator devices.

In the prior art lithographic apparatus, active devices are used in combination with the air springs, which are passive devices, although it is also known to use pneumatically controlled air springs, in which case the air springs are active devices for low frequencies, but may be regarded as passive devices for higher frequencies. Essentially, the active isolator devices may be regarded as active for frequencies where the air springs are or may be regarded as passive.

In the prior art lithographic apparatus, sensors detect any vibration of the metrology frame and the detected vibration is fed to a control system. In response to the detected vibrations, the control system determines a compensation to be performed by the active isolator devices. The compensation is intended to isolate and damp the detected vibration. The compensation also be employed to position the metrology frame with respect to the base frame.

The metrology frame has six degrees of freedom: translations in three directions and rotations in three directions. This implies that a vibration may be decomposed in those six (Cartesian or other orthogonal) directions and a vibration may be isolated and damped by compensations in those six directions. However, a compensation force in one direction may result in a movement not only in the one direction, but also in one or more of the other five directions. Thus, the control system needs to be a multiple-input multiple-output (MIMO) system. Such a system is a complex system, in particular if the system is unstable in at least one direction.

If the system is unstable in one direction, it needs to be stabilized by the control system, since a force exerted on the system in such an unstable direction may lead to an uncontrollable movement in the unstable direction, and may even lead to damage to the system. Generally, in a MIMO system, such instability and corresponding stabilization in one direction results in forces and vibrations in other directions, since the directions are coupled. Thus, an isolation and damping performance in a coupled other direction is compromised when the unstable direction is stabilized.

SUMMARY OF THE INVENTION

It is an aspect of the present invention to provide a vibration isolation system, wherein an unstable natural mode is stabilized without compromising isolation and damping performance in another direction.

The above aspect is achieved according to the present invention in a vibration isolation system for at least partially isolating and damping vibrations of a body, the system including a number of active isolator devices mechanically coupled to the body; and a control system for controlling the active isolator devices, wherein the control system is configured to: decouple vibrations in modal directions; determine a modal compensation signal for each modal direction; recouple each modal compensation signal into an active isolator control signal for each active isolator device; and stabilize at least one unstable natural mode of the body.

Modal decoupling decomposes movements, e.g. vibrations, in directions that correspond to directions of natural vibrations of the body (natural modes). Natural vibrations are a physical characteristic of a body and its coupling to its environment. The directions of the natural vibrations depend, for example, on the shape, the coupling with the environment, stiffness, material and other characteristics of the body.

An important feature of the natural vibrations is the fact that they are independent. That means that applying a force in a direction of a natural vibration results in a movement only in the direction of the respective natural vibration. Thus, a vibration in a modal direction may be isolated and damped by a modal compensation force in the same modal direction without causing movements or vibrations in other modal directions.

A control system in a vibration isolation system according to the present invention decouples any movement or vibration in modal directions resulting in one or more modal vibrations. Then, for each modal vibration, the control system determines a modal compensation signal. The modal compensation signal represents a force in the respective modal direction of the corresponding modal vibration, which force is to isolate and/or damp the modal vibration. Since the modal directions are independent, each single modal vibration may be isolated and/or damped by a single modal compensation signal. Thus, the control system may be a single-input single-output (SISO) system.

As the active isolator devices do not usually act in the modal directions, the modal compensation signals, one signal for each modal direction, are recoupled to the directions wherein the active isolator devices act.

The body, including the way it is supported, may have an unstable natural mode, i.e. natural vibration. Since an uncontrollable movement can occur in an unstable direction, there is no vibration isolation possible in the unstable direction. To stabilize such an unstable natural mode additional forces need to be introduced. With a modal control system, it is possible to generate such an additional force in the modal direction of the unstable natural mode without introducing forces in any other modal direction. Thus, the system characteristics may be shaped, and stabilized, in each modal direction, independently from any other modal direction.

To detect vibrations in the body, a number of sensors may be provided. The sensors detect vibrations in a number of arbitrary directions, for example the above mentioned Cartesian directions (translations in three perpendicular directions and three corresponding rotational directions). Otherwise, a mathematical transformation may be applied to these detected vibrations to obtain the vibrations in desired directions, for example the Cartesian directions. Also, a mathematical transformation may be applied to directly obtain the vibrations in the modal directions.

According to an aspect of the present invention, there is provided a lithographic apparatus including an illumination system configured to provide a beam of radiation; a support configured to support a patterning device, the patterning device configured to impart the beam with a pattern in its cross-section; a substrate table configured to hold a substrate; and a projection system configured to project the patterned beam onto a target portion of the substrate, wherein the projection system is supported by and positioned relative to a metrology frame, vibrations of the metrology frame being at least partially isolated and damped by a plurality of active isolator devices which are controllable by a control system, the control system being configured to: decouple vibrations in modal directions; determine a modal compensation signal for each modal direction; recouple each modal compensation signal in an active isolator control signal for each active isolator device; and stabilize at least one unstable natural mode of the metrology frame.

According to a further aspect of the present invention, there is provided a vibration isolation method for at least partially isolating and damping vibrations of a body, the method including detecting vibrations in the body; decoupling the detected vibrations in modal directions of the body; determining a modal compensation signal in each modal direction; transforming the modal compensation signal into an active isolator control signal for each of a number of active isolator devices which are mechanically coupled to the body; and feeding the active isolator control signals to the respective active isolator devices, wherein at least one unstable natural mode of the body is stabilized.

According to another aspect of the present invention, there is provided a device manufacturing method including projecting a patterned beam of radiation onto a target portion of a substrate, wherein disturbing vibrations in a projection system performing the projecting of the patterned beam of radiation are prevented by: detecting vibrations in the projecting system; decoupling the detected vibrations in modal directions of the projecting system; determining a modal compensation signal in each modal direction; recoupling the modal compensation signal into an active isolator control signal for each of a number of active isolator devices which are mechanically coupled to the projecting system; and feeding the active isolator control signals to the respective active isolator devices; wherein at least one unstable natural mode of the projecting system is stabilized.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned. In each example of patterning devices, the support may be a frame or table, for example, which may be fixed or movable as required and which may ensure that the patterning device is at a desired position, for example with respect to the projection system. Any use of the terms "reticle" or "mask" herein may be considered synonymous with the more general term "device means".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
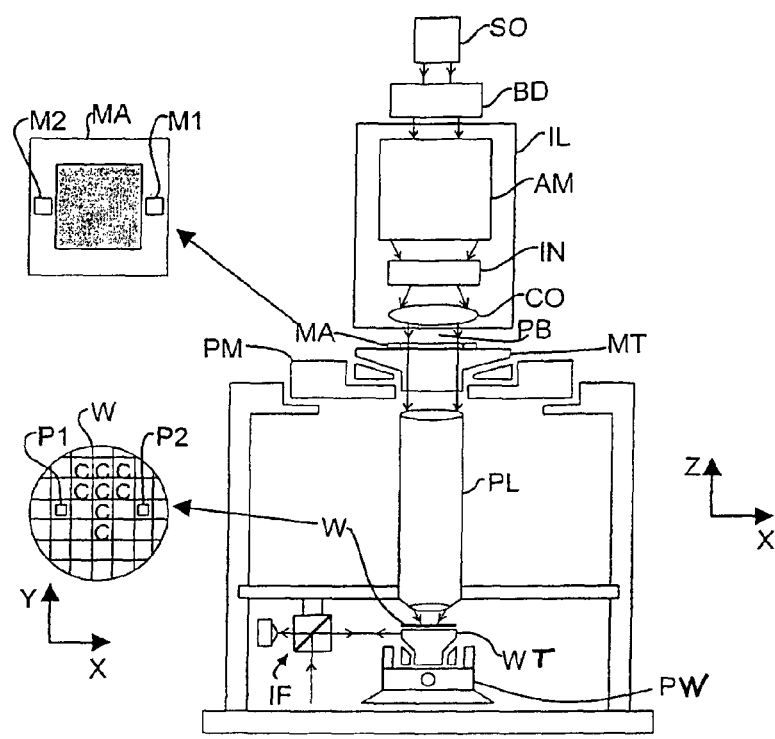
FIG. 1 depicts a lithographic apparatus according to an embodiment of the present invention.

FIG. 1 schematically depicts a lithographic apparatus according to exemplary embodiment of the present invention. The apparatus includes an illumination system (illuminator) IL configured to provide a beam of radiation PB (e.g. UV radiation or EUV radiation). A first support (e.g. a mask table) MT supports a patterning device (e.g. a mask) MA and is connected to a first positioning device PM that accurately positions the patterning device with respect to a projection system ("lens") PL. A substrate table (e.g. a wafer table) WT holds a substrate (e.g. a resist-coated wafer) W and is connected to a second positioning device PW that accurately positions the substrate with respect to the projection system. The projection system (e.g. a refractive projection lens) PL images a pattern imparted to the beam PB by the patterning device MA onto a target portion C (e.g. including one or more dies) of the substrate W.

As depicted here, the apparatus is of a transmissive type (e.g. employing a transmissive mask). Alternatively, the apparatus may be of a reflective type (e.g. employing a programmable mirror array of a type as referred to above).

The illuminator IL receives radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting device AM configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation PB having a desired uniformity and intensity distribution in its cross-section.

The beam PB is incident on the mask MA, which is held on the mask table MT. Having traversed the mask MA, the beam PB passes through the lens PL, which focuses the beam onto a target portion C of the substrate W. With the aid of the second positioning device PW and position sensor IF (e.g., an interferometric device), the substrate table WT can be moved accurately, e.g. so as to position different target portions C in the path of the beam PB. Similarly, the first positioning device PM and another position sensor (e.g., an interferometric device) (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at once (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e., a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
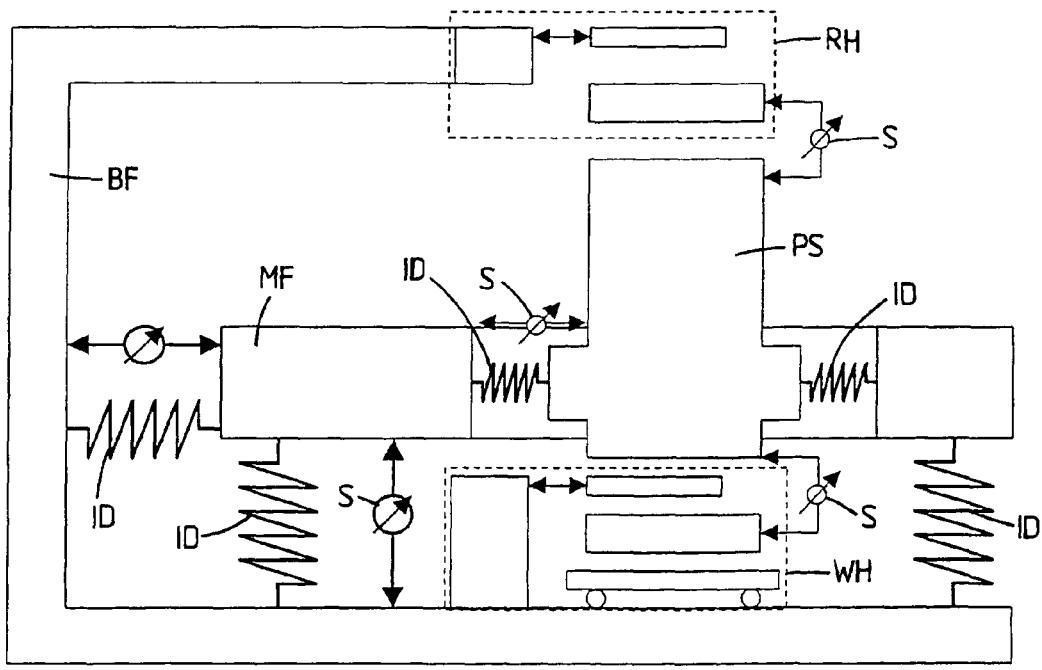
FIG. 2 schematically illustrates a lithographic apparatus having a base frame, a metrology frame and a projection system.

In FIG. 2 it is illustrated how a base frame BF, a metrology frame MF and a projection system PL of a lithographic apparatus are supported and positioned relative to each other. The base frame is coupled to the environment of the lithographic apparatus, which is, for example, positioned on a factory floor. All other elements of the lithographic apparatus are positioned relative to the base frame BF. For example, a reticle handling system RH receives a reticle, i.e. a lithographic mask, from the outside having the base frame BF as a reference point, and positions the received reticle relative to the projection system PL. Similarly, a wafer handling system WH receives a wafer, i.e. a substrate, from the outside and positions the wafer relative to the projection system PS.

Projection of a pattern from the reticle on the wafer is very sensitive to vibrations. Therefore, parts of the reticle handling system RH, a reticle support structure for example, parts of the wafer handling system WH, a wafer support structure for example, and the projection system PL are not rigidly mechanically coupled to the base frame BF, since the base frame BF may receive vibrations from the outside. If the base frame BF and the handling systems WH and RH and/or the projection system PL would be rigidly mechanically coupled, these vibrations from the outside would be transferred to the systems resulting in incorrect projections. Therefore, these systems may be supported by the base frame BF via a vibration isolation and damping system.

A known device to support a body and to isolate and damp vibrations from the outside is a spring or an air mount having spring-like characteristics. A mass-spring system including the body and the spring has a resonance frequency. A passive damping and isolation device only isolates and damps above the resonance frequency. Moreover, vibrations having a frequency, at least approximately, equal to the resonance frequency will not be damped, instead they will be amplified.

Active vibration isolation devices may compensate any undesirable characteristics of the passive isolation devices. A known active vibration isolation system comprises active isolation devices and a control system to control the active isolation devices. Such an active isolation system, in particular the control system thereof, may be configured to employ a modal decoupling technique. Modal decoupling is a coordinate transformation, usually from a Cartesian coordinate system, to a modal coordinate system. The modal coordinate system comprises coordinate axes that are orientated in the directions of the natural vibrations of the body concerned. The modal coordinate system is unique for each body and the way the body is coupled to the outside.

Referring again to FIG. 2, the metrology frame MF and the projection system PL are mechanically coupled to each other and to the base frame BF via vibration isolation devices ID. However, the coupling between the metrology frame MF and the projection system PL may also be stiff. The vibration isolation devices ID may include both passive and active devices, the active device compensating for any undesirable characteristics of the passive devices. Further a number of sensors S detect the relative positions and, if present, any vibrations of the separate bodies. A suitable vibration isolation device ID possibly also includes one or more sensors. An example of a suitable vibration isolation device ID is disclosed in Subrahmanyan et al., Active Vibration Isolation Design for a Photolithographic Stepper, In Proc. 6th International Symposium on Magnetic Bearings, pp. 10-21, 1998.

As may be seen in FIG. 2, a common center of gravity of the metrology frame MF and the projection system PL generally does not lie in a center of stiffness of the metrology frame MF or of the projection system PL. This may result in an unstable natural mode of the system. In particular, the common center of gravity may be translated vertically with respect to the geometric centers of the aforementioned frame MF and system PL. Thus, in particular, a natural mode in a substantially vertical or a rotational direction, in which direction a movement may bring the center of gravity downward with respect to the coupling points to the environment, may be unstable.

A control system, not shown in FIG. 2, receives sensor signals from sensors S indicating relative positions and vibrations and determines, in response, a control signal for each active isolation device in each isolation device ID. The control signals are subsequently fed to the respective active vibration isolation devices.

Figure 3:
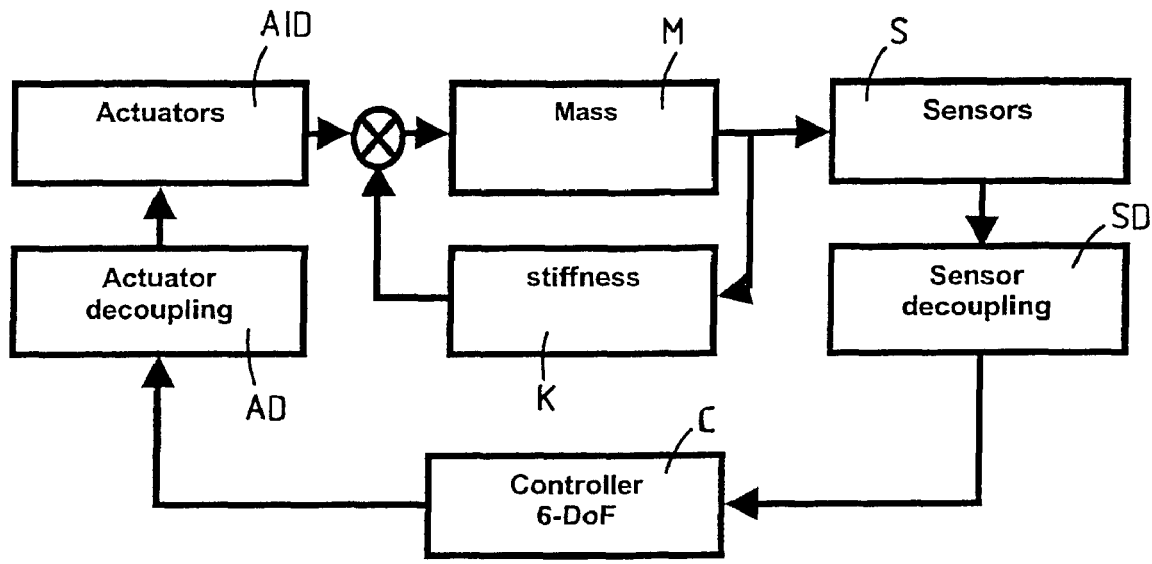
FIG. 3 schematically illustrates a control scheme of a prior art vibration isolation system.
Figure 4:
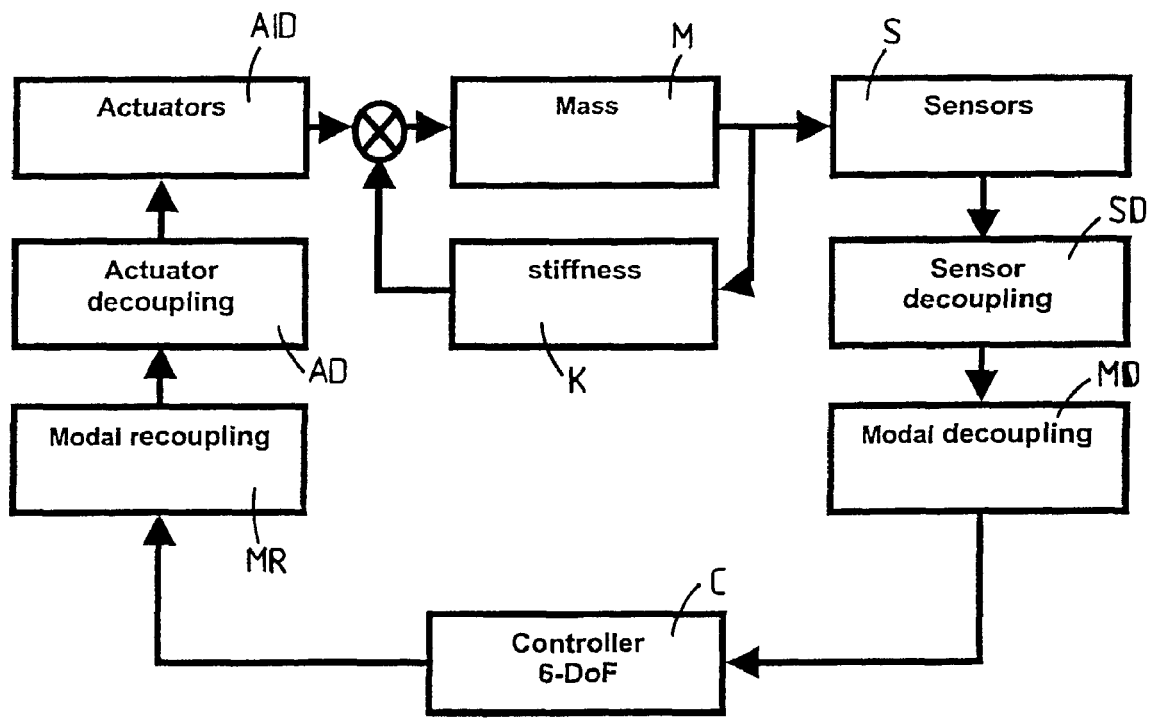
FIG. 4 schematically illustrates a control scheme of a vibration isolation system

How the vibration isolation system functions is explained in relation to FIG. 3 and FIG. 4. In FIG. 3, a control diagram of a prior art active vibration isolation system is shown, wherein a rigid body is represented by a mass M and a stiffness K, being modeled as a feedback circuit. This circuit model of a rigid body comprising a mass M and a stiffness K in a feedback circuit is deduced from the equations of motion which may be readily derived by a person skilled in the art.

The body may move in a number of degrees of freedom, e.g. translations and rotations in a number of directions. Sensors S detect any vibration in the rigid body. Since the sensors may detect vibrations in directions that are not identical to the directions of the degrees of freedom of the rigid body, sensor decoupling SD is performed to obtain vibrations in each degree of freedom. As known to a person skilled in the art, a body such as a metrology frame and projection system PS has six degrees of freedom: translations in three Cartesian directions (x, y and z-directions), and rotations in three Cartesian directions (Rx, Ry, and Rz-directions).

The detected and decoupled vibrations are input to a controller C. The controller C determines in response to the detected vibrations a force in each degree of freedom needed to compensate those vibrations. Next, by actuator decoupling AD, the forces are decoupled to forces that may be exerted by the active isolation devices included in the isolation devices ID. The actuator decoupled forces, represented by corresponding signals, are fed to the respective actuators AID, i.e. active isolation devices. In response to the signals the active isolation devices AID exert corresponding forces on the rigid body.

The circuit model of FIG. 4 represents a control diagram of a vibration isolation system according to the present invention including modal decoupling. It is noted that decoupling means a transformation of coordinate system such that the coordinate system includes independent axes. For example, sensor decoupling results in detected vibrations independent from the sensor positioning and detection. Modal decoupling is a transformation to a coordinate system having axes in the directions of the natural modes or eigenmodes of the corresponding body. Thus, vibrations of the body may be represented in the modal coordinate system by independent vibrations in the modal directions.

After sensor decoupling SD, modal decoupling MD is performed. However, both decoupling steps, SD and MD, may also be performed in one step, directly transforming from a sensor coordinate system to the modal coordinate system, omitting a transformation to a Cartesian coordinate system.

In FIG. 4, the controller C is configured to determine respective accelerations, to be enforced by the actuators, in the modal coordinate system in response to the modal vibrations determined by the modal decoupling. The control technique, and thus the configuration of the controller C, is simpler than in FIG. 3. Since the vibrations are independent in the modal directions, the controller C may regard the input vibrations as independent and may compensate (or correct) the vibrations independently. Thus, a vibration in one modal direction requires only one compensating acceleration in the same modal direction, as opposed to the control diagram of FIG. 3, wherein such a vibration may require a number of compensating accelerations in a respective number of (Cartesian) directions. Thus, the modal decoupling control strategy is very suitable to stabilize an unstable direction or natural mode of a body without compromising vibration isolation in other directions.

The compensation accelerations determined by the controller C and to be enforced by forces exerted by the actuators then need to be transformed to the actuator coordinate system. Again, this may be performed as indicated in FIG. 4 by two steps: modal recoupling MR and thereafter actuator decoupling AD, or in one step performing both actions, i.e. modal recoupling MR and actuator decoupling AD.

Modelling of the mechanical system, determining the corresponding equations of motion and modal decoupling are described in Subrahmanyan et al., Active Vibration Isolation Design for a Photolithographic Stepper, In Proc. 6th International Symposium on Magnetic Bearings, pp. 10-21, 1998, which is incorporated herein by reference.

The mass array M and the stiffness array K, or at least a fair estimate of the arrays M and K, are needed in the control method according to the present invention to obtain the required or desired amount of decoupling and damping. Such an estimate may be derived from a model, possibly refined using an iterative method. Also, the arrays M and K may be determined from measurements. However, if the natural modes of a body are known or determined directly, the mass array M and the stiffness array K are not required.

Figure 5:
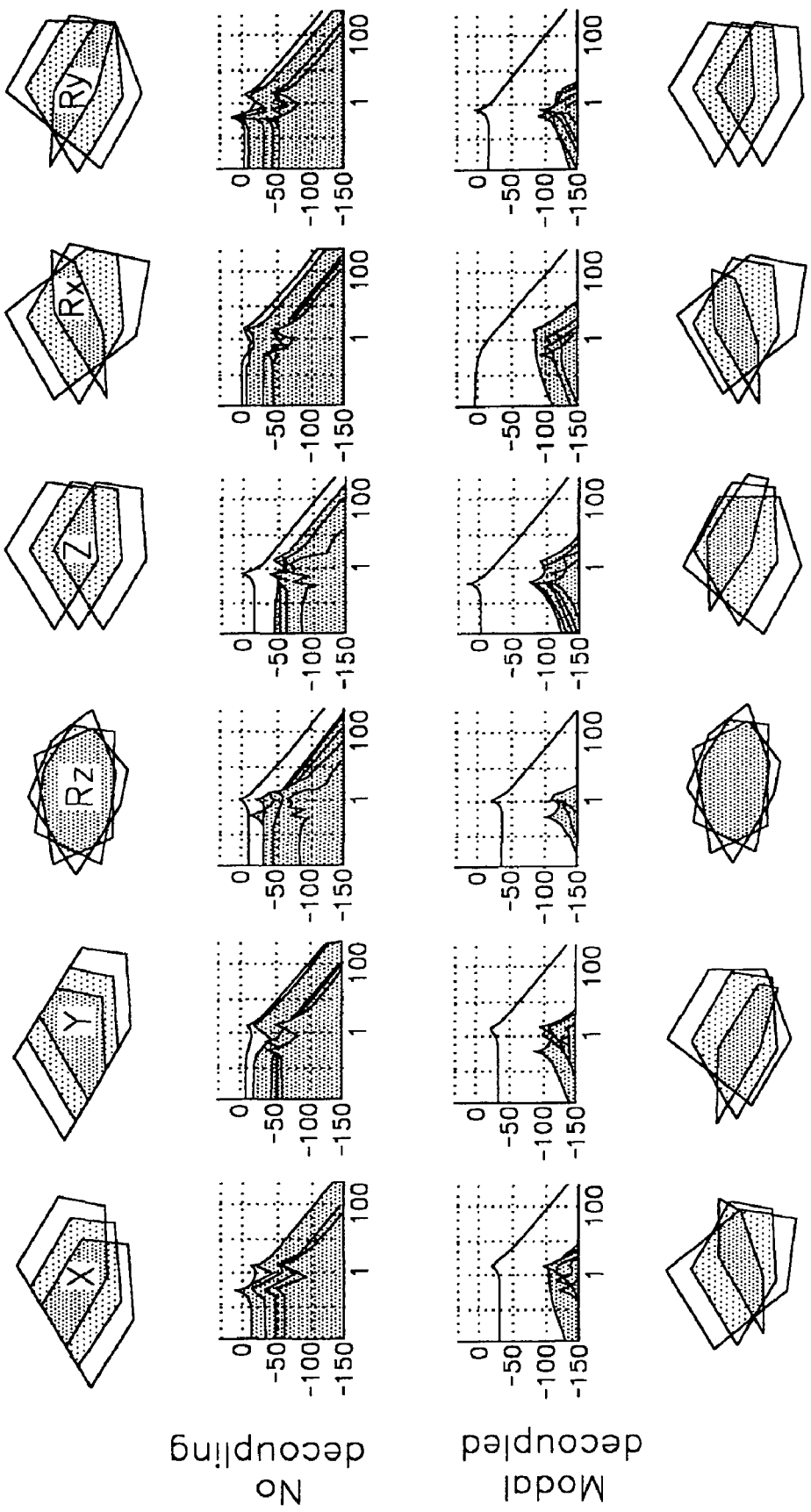
FIG. 5 depicts numerical results.

FIG. 5 shows numerical results obtained for a prior art vibration isolation system and a vibration isolation system according to the present invention. The results are organized in four rows and six columns. The first and second rows are obtained from the prior art system; the third and fourth rows are obtained from the system according to the present invention.

The upper row and the lower row represent each six degrees of freedom of an active vibration isolated system. The first row shows six orthogonal, in particular Cartesian, directions (X, Y, Rz, Z, Rx, Ry) for the degrees of freedom of the prior art system. The fourth row shows the modal directions for the subject body of the system according to the present invention.

The second and third rows show the corresponding sensitivities to vibrations in the Cartesian and modal directions, respectively. In the diagrams in the second and third row, the horizontal axis represents a frequency in Hz on a logarithmic scale. The vertical axis represents the amplification in dB, a negative value thus representing an attenuation. In each diagram six curves are shown indicating the sensitivity of a vibration in one direction corresponding to the corresponding upper or lower row in each of the six degrees of freedom.

The diagrams in the second row represent the sensitivities in the Cartesian directions. Most curves show at least two peaks indicating a coupling with at least one other direction. In the Z and the Rz directions however, one curve lies higher than other curves and shows only one peak, indicating that these directions have only a weak coupling with other directions.

Note that two of the modal directions, shown in the third and sixth column (third and fourth row), approach the Cartesian Rz-direction and Z-direction, respectively, closely. This implies that these Cartesian directions are close to modal directions and therefore are decoupled from other directions, which explains the above-mentioned and in the first and second row of FIG. 5 shown weak coupling of the Cartesian Rz-direction and Z-direction with other Cartesian directions.

In the third row, each diagram shows one curve lying substantially higher (50-100 dB) than the other five curves. Further, these curves show only one peak and thus it is concluded that the sensitivity in the direction indicated in the respective columns of the fourth row is not practically coupled with other directions. A vibration in one of the modal directions as indicated in the fourth row does not initiate a substantial vibration in another (modal) direction. In a system according to the present invention, this modal decoupling is employed to stabilize the unstable vertical natural mode without compromising the isolation and damping performance in any other direction.

While specific embodiments of the present invention have been described above, it will be appreciated that the invention may be practiced otherwise than as described. The description is not intended to limit the invention.

What is claimed is:

1. A vibration isolation system for at least partially damping and isolating vibrations of a body, the system comprising:
   a plurality of sensors mechanically coupled to the body configured to detect vibrations of the body;
   a plurality of active isolator devices mechanically coupled to the body; and
   a control system coupled to the active isolator devices that:
      (a) correlates vibrations measured in a first coordinate system with vibrations in modal directions based on natural modes or eigenmodes of the body,
      wherein the natural modes or eigenmodes of the body depend on physical characteristics of the body and the body's coupling to an environment, and are defined by the directions in which the body naturally vibrates;
      (b) transforms vibrations measured in a first coordinate system of the plurality of sensors into vibrations in modal directions, that comprise a second coordinate system, corresponding to the natural modes or eigenmodes of the body;
      (c) determines a modal compensation signal for each modal direction;
      (d) transforms each modal compensation signal into an active isolator control signal in the first coordinate system for each active isolator device; and
      (e) stabilizes at least one unstable natural mode of the body.

2. The system of claim 1, wherein the at least one unstable natural mode stabilized by the control system is directed substantially vertically.

3. The system of claim 1, wherein the body is positioned on a base frame by air mounts.

4. The system of claim 1, wherein a passive isolator device and an active isolator device engage the body at the same location on the body.

* * * * *

UNITED STATES PATENT AND TRADEMARK OFFICE
CERTIFICATE OF CORRECTION

PATENT NO. : 7,817,243 B2
APPLICATION NO. : 10/822139
DATED : October 19, 2010
INVENTOR(S) : Heertjes et al.

Page 1 of 1

It is certified that error appears in the above-identified patent and that said Letters Patent is hereby corrected as shown below:

Title Page, Item (56), Reference Cited section under "Other Publications", add "Translation of Notice of Reasons for Rejection dated 1/21/2008 for Japanese Patent Application No. 2005-140319."

Signed and Sealed this
Twenty-eighth Day of December, 2010

David J. Kappos
*Director of the United States Patent and Trademark Office*